United States Patent [19]

Dattilo

[11] Patent Number: 5,193,269
[45] Date of Patent: Mar. 16, 1993

[54] EXTRACTION TOOL FOR ELECTRONIC CIRCUIT COMPONENTS

[75] Inventor: Jerome P. Dattilo, Clarksville, Ind.

[73] Assignee: Robinson Nugent, Inc., New Albany, Ind.

[21] Appl. No.: 853,091

[22] Filed: Mar. 18, 1992

[51] Int. Cl.$^5$ .......................................... H05K 13/04
[52] U.S. Cl. ........................................ 29/764; 29/741
[58] Field of Search ................. 29/741, 764, 758, 256, 29/258

[56] References Cited

U.S. PATENT DOCUMENTS 4,866,838 9/1989 Porter .................................. 29/741
5,052,101 10/1991 Bright et al. .
5,062,201 11/1991 Long, Jr. .

OTHER PUBLICATIONS

"PGA-Inserter", Micro Electronic Systems, Inc., Bridgewater, Conn., one page, date unknown.
"PGA-Extractor", Micro Electronic Systems, Inc., Bridgewater, Conn., one page, date unknown.

Primary Examiner—Carl E. Hall
Attorney, Agent, or Firm—Barnes & Thornburg

[57] ABSTRACT

An extraction tool is provided for extracting an electronic circuit component. The tool includes an outer jaw assembly having a top plate and at least two outer legs coupled to the top plate defining an interior region therebetween. An inner jaw assembly is located in the interior region. The inner jaw assembly includes a bottom plate and at least two inner legs coupled to the bottom plate for engaging the chip. The apparatus also includes a slide collar slidably coupled to the outer and inner jaw assemblies. The collar is movable between a first position to permit the outer and inner legs to be inserted over the chip and a second position to lock the outer and inner legs in a predetermined engaging position relative to the chip. The apparatus further includes a mechanism for moving the inner jaw assembly relative to the outer jaw assembly when the collar in its second position to extract the chip. The length of the legs of the tool is selected to permit extraction of both large and small profile chips.

30 Claims, 3 Drawing Sheets 5,193,269

EXTRACTION TOOL FOR ELECTRONIC CIRCUIT COMPONENTS

BACKGROUND AND SUMMARY OF THE INVENTION

The present invention relates to an extraction tool for removing an electronic circuit component from a socket. More particularly, the present invention relates to an apparatus for removing electronic circuit component from a socket without damaging the electronic circuit component, the socket, or conductive traces on a printed circuit board coupled to the socket.

The present invention is designed to remove electronic circuit chips such as Pin Grid Array (PGA) devices from PGA sockets coupled to printed circuit boards. The present invention is designed to reduce the likelihood of bending or damaging leads on the chip during removal of the chip from the socket. In addition, the present invention is designed to remove the chip from the socket without damaging conductive traces on the surface of the printed circuit board.

One feature of the present invention is the provision of chip removal blades or legs which are biased to a normally open position. A slide collar is provided to lock the legs in engagement with the chip. Therefore, the legs are held in a closed position over the chip so that the chip will not slip out from the legs during removal or extraction of the chip. The length of the legs of the present invention is selected to permit the extraction apparatus to accommodate both large and small profile chips. Specifically, the length of the legs allows the legs to flex enough the accommodate large profile PGA devices which are typically 0.100 inch larger than small profile PGA devices. The legs also provide enough clearance to permit extraction of chips which include large heat sinks.

The extraction apparatus of the present invention uses the mechanical advantage of a screw assembly to generate the force required to extract the chip from the socket. The screw assembly moves a set of inner legs upwardly relative to a set of outer legs to extract the chip from a socket. Preferably, the apparatus applies the extraction force to all four sides of the chip to reduce the likelihood of damaging the chip.

According to one aspect of the present invention, an apparatus is provided for extracting an electronic chip. The apparatus includes an outer jaw assembly having a top plate and at least two outer legs coupled to the top plate defining an interior region therebetween. An inner jaw assembly is located in the interior region. The inner jaw assembly includes a bottom plate and at least two inner legs coupled to the bottom plate for engaging the chip. The apparatus also includes a collar slidably coupled to the outer and inner jaw assemblies. The collar is movable between a first position to permit the outer and inner legs to be inserted over the chip and a second position to lock the outer and inner legs in a predetermined engaging position relative to the chip. The apparatus further includes means for moving the inner jaw assembly relative to the outer jaw assembly when the collar is in its second position to extract the chip.

The moving means illustratively includes a threaded stem extending through the outer jaw assembly. The threaded stem is threadably coupled to the bottom plate to move the inner jaw assembly relative to the outer jaw assembly upon rotation of the threaded stem.

According to another aspect of the present invention, the outer and inner legs are situated at a predetermined angle relative to the top and bottom plates, respectively, so that the outer and inner legs are biased radially outwardly to a normally open position when the collar is in its first position. Each outer leg is situated adjacent to an inner leg to form an outer and inner leg pair. The collar includes a sliding surface adjacent each pair of outer and inner legs. The sliding surfaces force each pair of outer and inner legs radially inwardly to a closed position upon movement of the collar from its first position to its second position to lock the inner legs in engagement with the chip. Each of the outer and inner legs is formed to include an elongated slot therein for receiving a portion of a fastener therethrough to guide movement of the collar relative to the outer and inner legs. The fastener is movable in the elongated slots to permit movement of the collar from the first position to the second position.

According to yet another aspect of the present invention, each inner leg is formed to include a radially inwardly projecting flange for engaging the chip to extract the chip from the socket as the inner leg assembly is moved by the moving means. Each outer leg is formed to include a radially inwardly projecting flange for engaging the socket. The flange of each inner leg is configured abut the flange of an adjacent outer leg. The abutting inner and outer flanges enter a gap between the chip and the socket as the collar moves from its first position to its second position to lock the inner legs in engagement with the chip.

Each outer leg is coupled to the top plate by a spacer block which permits limited movement of each outer leg relative to the top plate to maintain alignment between the flanges of the inner and outer legs. A compression spring is situated inside the interior region between the top and bottom plates to hold the inner legs in a predetermined position relative to the outer legs prior to movement of the inner jaw assembly by the moving means.

Additional objects, features, and advantages of the invention will become apparent to those skilled in the art upon consideration of the following detailed description of a preferred embodiment exemplifying the best mode of carrying out the invention as present perceived.

DETAILED DESCRIPTION OF THE DRAWINGS

Figure 1:
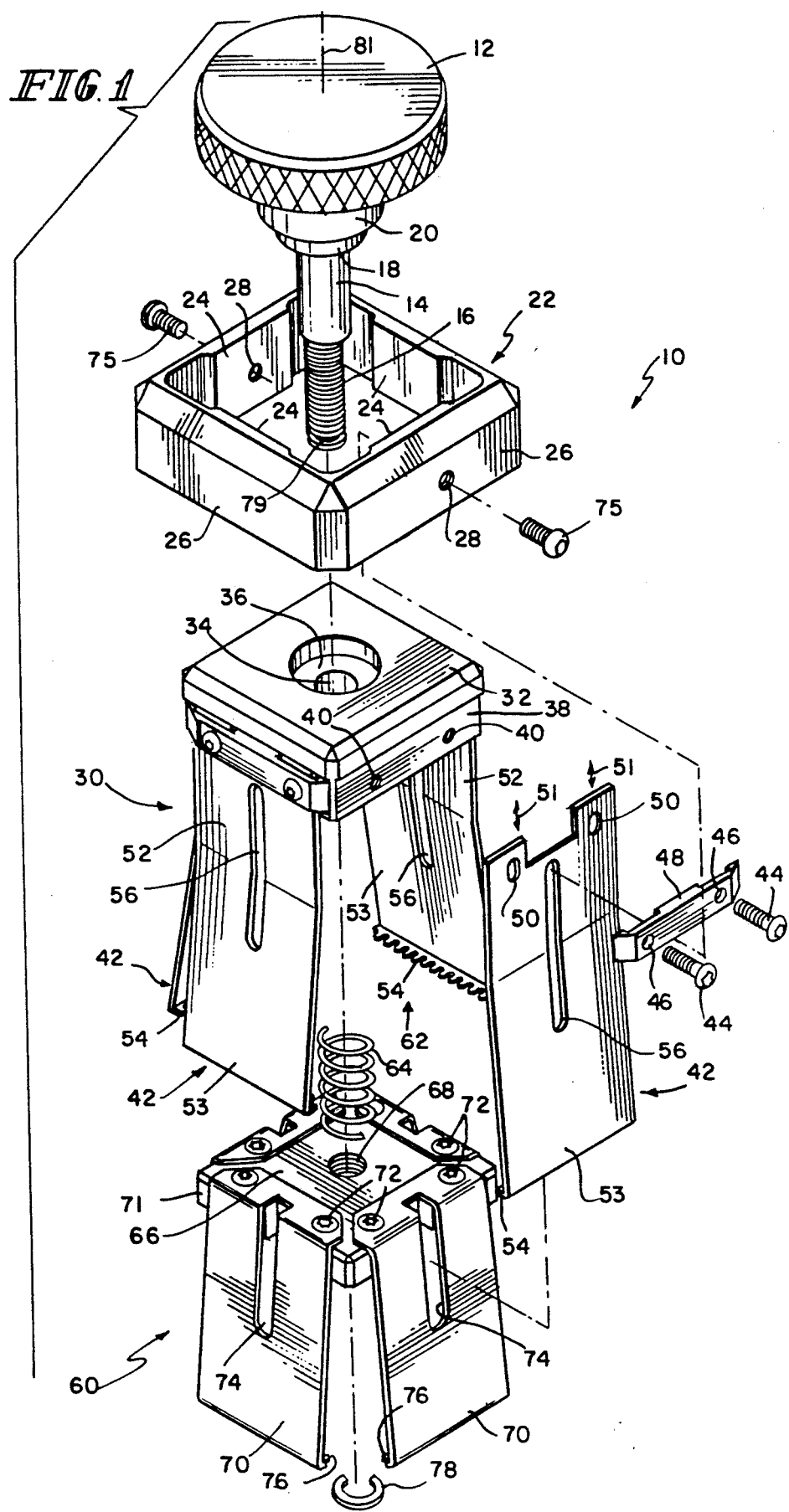
FIG. 1 is an exploded perspective view of an extraction apparatus of the present invention including a control handle coupled to a threaded stem, a sliding collar, an outer leg assembly, and an inner leg assembly.

Referring now to the drawings, FIG. 1 illustrates an extraction apparatus 10 including a control handle 12 coupled to a center stem 14 having a threaded section 16. Center stem 14 is preferably made of steel and has a hard chrome finish. A washer 18 is situated on stem 14.

Handle 12 is formed to include a neck section 20. Washer 18 has a diameter smaller than the diameter of neck section 20. Extraction apparatus 10 also includes a rectangular slide collar 22 including inner sliding surfaces 24 and outer side walls 26. Slide collar 22 is formed to include an aperture 28 extending from each outer side wall 26 to the adjacent inner sliding wall 24 Slide collar 22 is preferably made from a hard durable plastic material.

An outer jaw assembly 30 includes a top plate 32 formed to include an aperture 34 therein. Top plate 32 is preferably made of a hard durable plastic material. Stem 14 extends through aperture 34. A recessed section 36 surrounds aperture 34 for receiving washer 18. Each side wall 38 of top plate 32 is formed to include a pair of spaced apart threaded apertures 40 therein. A generally rectangularly shaped outer leg 42 is coupled to each of the four side walls 38 of top plate 32 by suitable fasteners 44. Outer legs 42 are preferably made from a stainless steel stock about 0.015 to 0.017 inch thick. Fasteners 44 extend through apertures 46 in a spacer block 48, through apertures 50 in outer leg 42, and into threaded apertures 40 of top plate 32. Spacer blocks 48 permit limited movement of outer legs 42 relative to top plate 32 in the direction of double headed arrows 51 as discussed in detail below. Each outer leg 42 includes a first section 52, a spring section 53 and an inwardly extending flange 54. Spring section 53 is illustratively aligned at a 5° angle relative to first section 52. Therefore, outer legs 42 are biased to a normally open position for insertion over an electrical circuit chip 80 as discussed below with reference to FIGS. 2 and 3. Each outer leg 42 is also formed to include an elongated slot 56 for slidably coupling slide collar 22 to leg 42.

An inner jaw assembly 60 is located in an interior region 62 defined between the four outer legs 42 of outer jaw assembly 30. A compression spring 64 is located between outer jaw assembly 30 and inner jaw assembly 60. Inner jaw assembly 60 includes a bottom plate 66 which is formed to include a threaded aperture 68 therein. Bottom plate 66 is preferably made from steel with a hard chrome finish. Threaded aperture 68 threadably receives threaded section 16 of center stem 14 upon assembly of the extraction apparatus 10. An inner leg 70 is coupled adjacent to each side wall 71 of bottom plate 66 by fasteners 72. Inner legs 70 are preferably made from a stainless steel stock about 0.015-0.017 inch thick. Each inner leg 70 is formed to include an elongated slot 74 for receiving a suitable fastener therethrough such as threaded bolt 75 to slidably couple the slide collar 22 to the outer legs 42 and inner legs 70. Each inner leg 70 is situated adjacent to an outer leg 42 to form an outer and inner leg pair. Threaded bolt 75 extends through threaded aperture 28 of slide collar 22, through slot 56 of outer leg 42, and through a slot 74 of inner leg 70 to guide movement of slide collar 22 relative to inner and outer jaw assemblies 60 and 30. Each inner leg 70 also includes an inwardly extending flange 76. Inner legs 70 are illustratively aligned at a predetermined angled relative to side walls 71 of bottom plate 66. The predetermined angle is illustratively an angle of 5° to match the angle of spring sections 53 of outer legs 42. It is understood that a different predetermined angle may be selected depending on the application for which the apparatus 10 is used. An E-ring or lock washer 78 is coupled to groove 79 in threaded section 16 of center stem 14 to limit the range of movement of bottom plate 66 relative to the center stem 16 during operation of the extraction apparatus 10.

Top plate 32 includes four side walls 38. Bottom plate 66 includes four side walls 71. An outer leg 42 is coupled adjacent each of the four side walls 38 of top plate 32, and an inner leg 70 is coupled adjacent each of the four side walls 71 of the bottom plate 66. Outer legs are aligned at said predetermined angle relative to an adjacent side wall 38 of top plate 32. Inner legs 70 are aligned at said predetermined angle relative to an adjacent side wall 71 of bottom plate 66. Therefore, outer and inner legs 42 and 70 are biased radially outwardly from a longitudinal axis 81 of the outer and inner jaw assemblies 30 and 60 to a normally open position illustrated in FIG. 2 when collar 22 is in its first position. As collar 22 moves to its second position illustrated in FIG. 3, sliding surfaces 24 engage and force each pair of outer and inner legs 42 and 70 to a closed or locked position relative to chip 80. Therefore, collar 22 provides means for forcing the outer and inner legs 42 and 70 radially inwardly to a closed position illustrated in FIG. 3 after the outer and inner legs 42 and 70 are inserted over chip 80 to lock the outer and inner legs 42 and 70 in a predetermined position relative to the chip 80.

Figure 2:
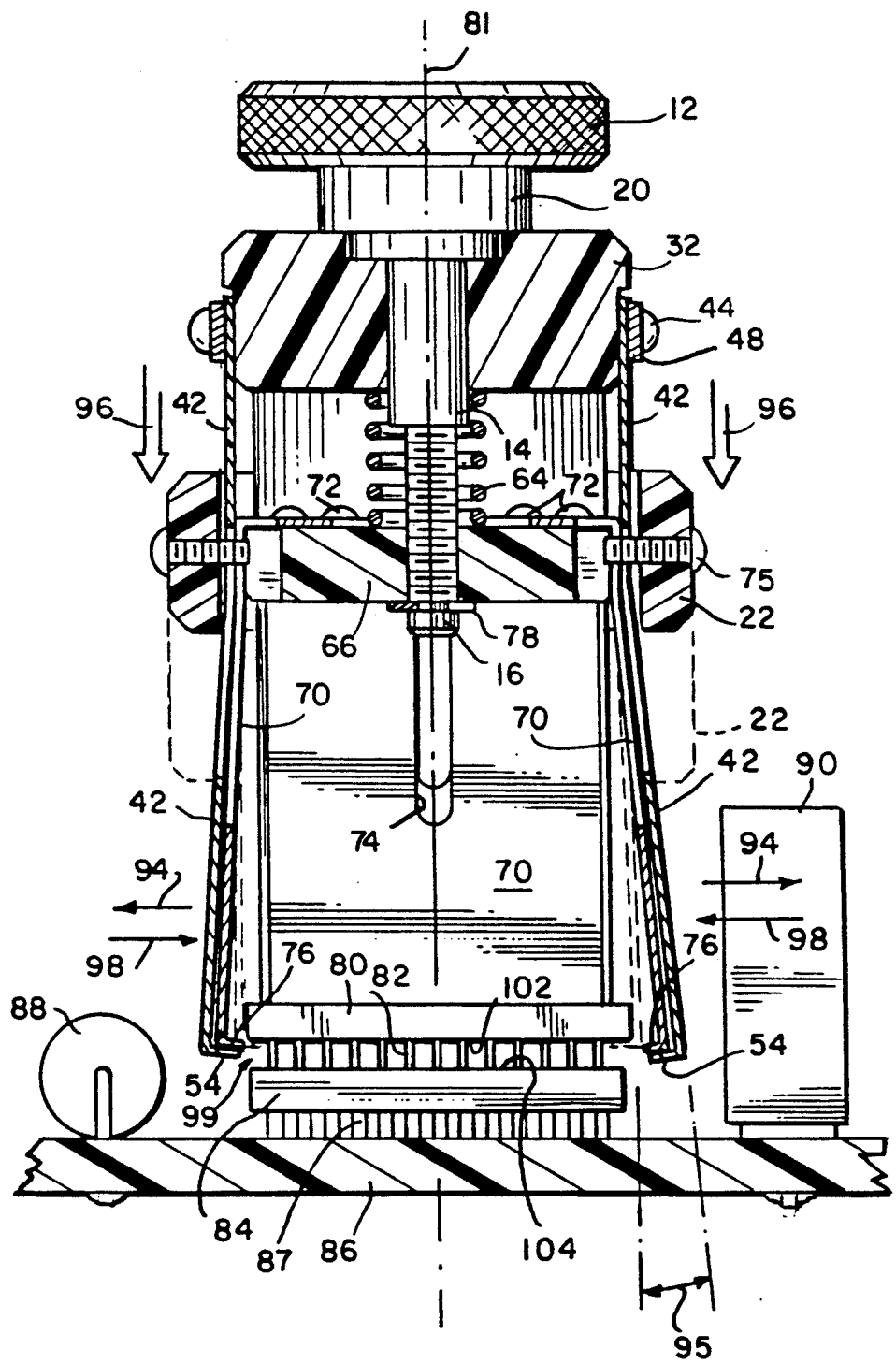
FIG. 2 is a sectional view taken through the extraction apparatus of FIG. 1 illustrating operation of the extraction apparatus as the apparatus is inserted over an electronic circuit chip in preparation for removing the chip from a socket coupled to a circuit board.
Figure 3:
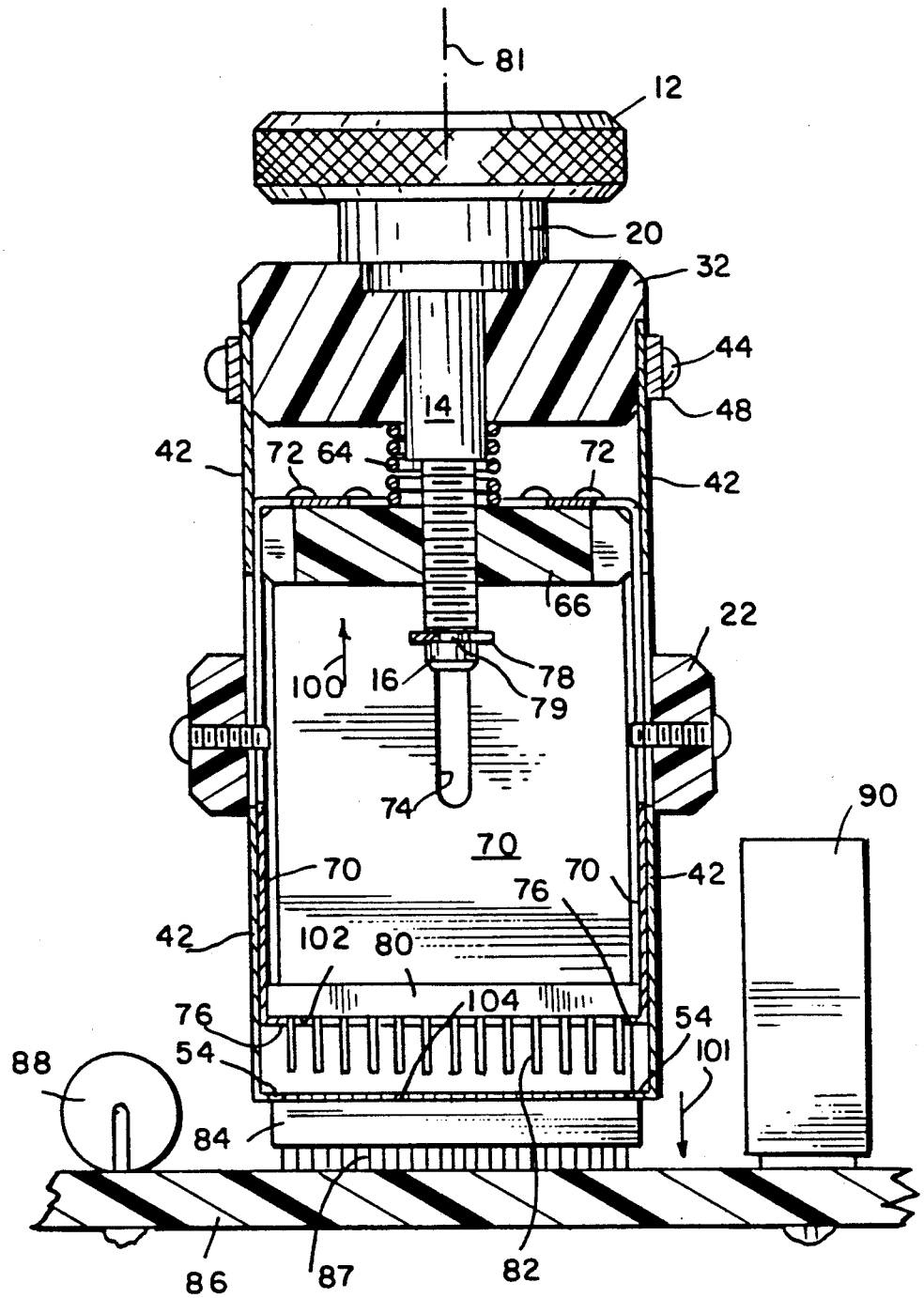
FIG. 3 is a sectional view similar to FIG. 2 illustrating operation of the extraction apparatus as the chip is removed from the socket.

Operation of the extraction apparatus 10 is illustrated in FIGS. 2 and 3. Extraction apparatus 10 is designed to remove an electronic circuit component or chip 80 including a plurality of connector pins 82 from a socket 84 which is coupled to a printed circuit board 86 by leads 87. The chip 80 is often located in tight quarters between adjacent electrical components 88 and 90 also coupled to circuit board 86 so that removal of chip 80 is difficult. Care must be taken not to damage components 88 and 90 or the leads 87 coupling socket 84 to circuit board 86. The extraction apparatus 10 is designed to remove chip 80 from socket 84 without damaging chip 80, socket 84, or the other components 88 and 90 located around the chip 80. In addition, extraction apparatus !0 removes chip 80 from socket 84 without damaging conductive traces formed on printed circuit board 86.

Illustratively, chip 80 is a Pin Grid Array (PGA) device. PGA devices are often difficult to remove from sockets 84 due to a large number of connector pins 82. Therefore, a large extraction force is required to remove the PGA devices. Uneven extraction forces can damage the PGA device. It is desirable to have an extraction tool which applies a force only to the socket 84, and not to the printed circuit board 86. This prevents damage to leads 87 or conductive traces on circuit board 86. Outer legs 42 and inner legs 70 have a length sufficient to permit removal large or small chips 80 which include large heat sinks (not shown) mounted to the top of chip 80.

In operation, slide collar 22 is moved upwardly toward top plate 32 of outer jaw assembly 30 to a first position illustrated in FIG. 2. This permits the inner legs 70 and outer legs 42 to spring radially outwardly in the direction of arrows 94 to their normally open position illustrated in FIG. 2. Inner legs 70 and spring sections 53 of outer legs 42 are aligned at a predetermined angle relative to side walls 38 of top plate 32 and side walls 71 of bottom plate 66 as illustrated by angle 95. Angle 95 is about 5°. Bottom plate 66 is positioned near lock washer 78 as extraction apparatus 10 is inserted over chip 80. Compression spring 64 helps maintain flanges 76 of inner legs 70 in engagement with flanges 54 of outer legs 42 upon insertion of the extraction apparatus over chip 80. Because spacer blocks 48 are coupled to outer legs 42, fasteners 44 cannot rigidly secure outer legs 42 to top plate 32. Therefore, outer legs 42 can move slightly relative to top plate 32 so that the flanges 76 on inner legs 70 abut flanges 54 of outer legs 42 over the entire length of the flanges 76 and 54. Extraction apparatus 10 is then positioned over chip 80 so that the inner legs 70 and outer legs 42 surround chip 80 coupled to socket 84. Slide collar 22 is then moved downwardly in the direction of arrows 96 to the dotted second position illustrated in FIG. 2. This causes sliding surfaces 24 of slide collar 22 to engage outer legs 42 and to force outer legs 42 and inner legs 70 radially inwardly in the direction of arrows 98 so that flanges 54 and 76 on outer legs 42 and inner legs 70, respectively, are positioned in a gap 99 between chip 80 and socket 84 as illustrated by the dotted lines in FIG. 2. In other words, movement of slide collar 22 in the direction of arrows 96 locks the inner legs 70 in engagement with chip 80 and locks outer legs 42 in a predetermined position adjacent inner legs 70. It is understood that other types of mechanisms may be used in place of collar 22. For instance, a clamping arrangement or other means for forcing outer and inner legs 42 and 70 radially inwardly may be used.

After the flanges 76 and 54 are locked in position between chip 80 and socket 84 by moving slide collar 22 to its second position, handle 12 is rotated to rotate threaded stem 14 so that threaded bottom plate 66 begins to move upwardly relative on threaded section 16 of threaded stem 14 in the direction of arrow 100 illustrated in FIG. 3. Therefore, threaded stem 14 provides means for moving inner jaw assembly 60 relative to outer jaw assembly 30. It is understood that other types of moving means such as a camming arrangement may be used to move inner jaw assembly 60.

Spring 64 is compressed within inner region 62 as the bottom plate 66 moves upwardly relative to top plate 32. Movement of bottom plate 66 also causes movement of inner legs 70 upwardly in the direction of arrow 100. Inwardly extending flanges 76 of inner legs 70 engage a bottom surface 102 of chip 80. All four sides of chip 80 are engaged by a respective flange 76 of an inner leg 70 adjacent each side. Flanges 54 of outer legs 42 engage a top surface 104 of socket 84. Outer jaw assembly 30 remains in a fixed position relative to handle 12 upon rotation of handle 12. Therefore, outer legs 42 do not move when handle 12 is rotated. Movement of inner legs 70 and flanges 76 in the direction of arrow 100 as the handle 12 is rotated causes flanges 76 to apply an extraction force to bottom surface 102 of chip 80 to move chip 80 upwardly in the direction of arrow 100 to extract chip 80 from socket 84. Flanges 54 of outer legs 42 apply a downwardly directed force on top surface 104 of socket 84 in the direction of arrow 101 to prevent socket 84 from moving upwardly with chip 80. Slide collar 22 maintains the engagement of inner legs 70 and flanges 76 with chip 80. After chip 80 is extracted, slide collar 22 is moved upwardly in the direction of arrow 100 back to the first position illustrated in FIG. 2 so that inner legs 70 and outer legs 42 spring radially outwardly to their normally open positions in the direction of arrows 94 to release chip 80 from extraction apparatus 10.

It is understood that the extraction apparatus 10 can be use to extract a chip directly from sockets coupled to a circuit board. The flanges 54 of outer legs 42 can abut the circuit board directly to permit inner jaw assembly 60 to remove a chip attached directly to the circuit board.

Although the invention has been described in detail with reference to a certain preferred embodiment, variations and modifications exist within the scope and spirit of the invention as described and defined in the following claims.

What is claimed is:

1. An apparatus for extracting an electronic chip, the apparatus comprising:
   an outer jaw assembly including a top plate and at least two outer legs coupled to the top plate defining an interior region therebetween;
   an inner jaw assembly located in said interior region, the inner jaw assembly including a bottom plate and at least two inner legs coupled to the bottom plate for engaging the chip;
   a collar coupled to the outer and inner jaw assemblies, the collar being movable between a first position to permit the outer and inner legs to be inserted over the chip and a second position to lock the outer and inner legs in a predetermined position relative to the chip; and
   means for moving the inner jaw assembly relative to the outer jaw assembly when the collar is in its second position to extract the chip.

2. The apparatus of claim 1, wherein the moving means includes a threaded stem extending through the outer jaw assembly, the threaded stem being threadably coupled to the bottom plate to move the inner jaw assembly relative to the outer jaw assembly upon rotation of the threaded stem.

3. The apparatus of claim 1, wherein the outer and inner legs are situated at a predetermined angle relative to the top and bottom plates, respectively, so that the outer and inner legs are biased radially outwardly to a normally open position when the collar is in its first position.

4. The apparatus of claim 3, wherein each outer leg is situated adjacent to an inner leg to form an outer and inner leg pair, and the collar includes a sliding surface adjacent each pair of outer and inner legs, the sliding surfaces forcing each pair of outer and inner legs radially inwardly to a closed position upon movement of the collar from its first position to its second position.

5. The apparatus of claim 4, wherein each of the outer and inner legs is formed to include an elongated slot therein for receiving a fastener therethrough to couple the collar to the outer and inner legs, the fastener being movable in the elongated slots to permit movement of the collar from the first position to the second position.

6. The apparatus of claim 1, wherein each outer leg is coupled to the top plate by a spacer block which permits limited movement of each outer leg relative to the top plate to maintain alignment between the inner and outer legs.

7. The apparatus of claim 1, further comprising a compression spring situated inside the inner region between the top and bottom plates to hold the inner legs in a predetermined position relative to the outer legs prior to movement of the inner jaw assembly by the moving means.

8. The apparatus of claim 1, wherein each outer leg is formed to include a radially inwardly projecting flange for engaging a socket holding the chip therein, and each inner leg is formed to include a radially inwardly projecting flange for engaging the chip to extract the chip from the socket as the inner jaw assembly is moved by the moving means.

9. The apparatus of claim 8, wherein the flange of each inner leg is configured to abut the flange of an adjacent outer leg so that the abutting flanges enter a gap between the chip and the socket as the collar moves from its first position to its second position to lock the inner legs in engagement with the chip.

10. An apparatus for extracting an electronic chip from a socket, the apparatus comprising:
   a fixed outer jaw assembly including means for engaging the socket, the outer jaw assembly including an interior region for receiving the chip therein;
   a movable inner jaw assembly located in said interior region, the inner jaw assembly including means for engaging the chip;
   a collar slidably coupled to the outer and inner jaw assemblies, the collar being movable from a first position to permit insertion of the outer and inner jaw assemblies over the chip to a second position to lock the outer and inner assemblies in a predetermined position relative to the chip, with the inner jaw assembly engaging the chip; and
   means for moving the inner jaw assembly relative to the outer jaw assembly after the collar is in its second position to extract the chip.

11. The apparatus of claim 10, wherein the moving means includes a threaded stem extending through the outer jaw assembly, the threaded stem being threadably coupled to the inner jaw assembly to move the inner jaw assembly relative to the outer jaw assembly to extract the chip upon rotation of the threaded stem.

12. The apparatus of claim 10, wherein the outer jaw assembly includes a top plate and at least two outer legs coupled to the top plate and the means for engaging the socket includes a radially inwardly projecting flange formed on each outer leg for engaging the socket, and wherein the inner jaw assembly includes a bottom plate and at least two inner legs coupled to the bottom plate and the means for engaging the chip includes a radially inwardly projecting flange formed on each inner leg for engaging the chip to remove the chip from the socket as the inner jaw assembly is moved by the moving means.

13. The apparatus of claim 12, wherein the outer and inner legs are situated at a predetermined angle relative to the top and bottom plates, respectively, so that the outer and inner legs are biased radially outwardly to a normally open position when the collar is in its first position.

14. The apparatus of claim 13, wherein each of the outer and inner legs is formed to include an elongated slot therein for receiving a fastener therethrough to couple the collar to the outer and inner legs, the fastener being movable in the elongated slots to permit movement of the collar from the first position to the second position.

15. The apparatus of claim 13, wherein each outer leg is situated adjacent to an inner leg to form an outer and inner leg pair, and the collar includes a sliding surface adjacent each pair of outer and inner legs, the sliding surface forcing the pair of outer and inner legs radially inwardly upon movement of the collar from its first position to its second position.

16. The apparatus of claim 12, wherein the flange of each inner leg is configured abut the flange of an adjacent outer leg so that the abutting flanges enter a gap between the chip and the socket as the collar moves from its first position to its second position to lock the inner legs in engagement with the chip.

17. The apparatus of claim 16, wherein each outer leg is coupled to the top plate by a spacer block which permits limited movement of each outer leg relative to the top plate to maintain alignment between the flanges of the inner and outer legs.

18. The apparatus of claim 16, further comprising a compression spring situated inside the interior region between the top and bottom plates to hold the flanges on the inner legs against the flanges on the outer legs prior to movement of the inner jaw assembly by the moving means.

19. An apparatus for extracting an electronic chip from a socket, the apparatus comprising:
   fixed outer jaw assembly including a top plate and at least two outer legs aligned at a predetermined angle relative to top plate, the at least two outer legs being coupled to the top plate to define an interior region therebetween;
   an inner jaw assembly located in said interior region, the inner jaw assembly including a bottom plate and at least two inner legs being coupled to the bottom plate aligned at substantially said predetermined angle relative to the bottom plate so that the outer and inner legs are biased radially outwardly to a normally open position aligned at said predetermined angle relative to the top and bottom plates, respectively, to permit the outer and inner legs to be inserted over the chip;
   means for forcing the outer and inner legs radially inwardly to a closed position after the outer and inner legs are inserted over the chip to lock the outer and inner legs in a predetermined position engaging the chip; and
   means for moving the inner jaw assembly relative to the outer jaw assembly after the collar is in its second position to extract the chip from the socket.

20. The apparatus of claim 19, wherein the moving means includes a threaded stem extending through the outer jaw assembly, the threaded stem being threadably coupled to the bottom plate to move the inner jaw assembly relative to the outer jaw assembly upon rotation of the threaded stem.

21. The apparatus of claim 19, wherein the top and bottom plates each include four side walls, an outer leg being coupled to the top plate adjacent each of the four side walls of the top plate and an inner leg being coupled to the bottom plate adjacent each of the four side walls of the bottom plate, the outer and inner legs being aligned at said predetermined angle relative to an adjacent side wall of the top and bottom plates, respectively, so that the outer and inner legs are biased radially outwardly to a normally open position.

22. The apparatus of claim 21, wherein said predetermined angle is about 5 degrees.

23. The apparatus of claim 19, wherein the forcing means includes a collar coupled to the outer and inner jaw assemblies, the collar being movable from a first position to permit the outer and inner legs to move radially outwardly to the normally open position aligned at said predetermined angle relative to the top and bottom plates, respectively, to permit the outer and inner legs to be inserted over the chip and a second position to force the outer and inner legs radially inwardly so that the inner legs engage the chip.

24. The apparatus of claim 23, wherein each outer leg is situated adjacent to an inner leg to form an outer and inner leg pair, and the collar includes a sliding surface adjacent each pair of outer and inner legs, the sliding surface forcing the pair of outer and inner legs radially inwardly upon movement of the collar from its first position to its second position.

25. The apparatus of claim 24, wherein each of the outer and inner legs is formed to include an elongated slot therein for receiving a fastener therethrough to couple the collar to the outer and inner legs, the fastener being movable in the elongated slots to permit movement of the collar from the first position to the second position.

26. The apparatus of claim 19, wherein each inner leg is formed to include a radially inwardly projecting flange for engaging the chip to extract the chip from the socket as the inner jaw assembly is moved by the moving means.

27. The apparatus of claim 26, wherein each outer leg is formed to include a radially inwardly projecting flange for engaging the socket.

28. The apparatus of claim 27, wherein the flange of each inner leg is configured abut the flange of an adjacent outer leg, the abutting flanges entering a gap between the chip and the socket as the outer and inner legs are moved radially inwardly by the forcing means to lock the inner legs in engagement with the chip.

29. The apparatus of claim 27, wherein each outer leg is coupled to the top plate by a spacer block which permits limited movement of each outer leg relative to the top plate to maintain alignment between the inner and outer legs.

30. The apparatus of claim 27, further comprising a compression spring situated inside the inner region between the top and bottom plates to hold the inner legs in a predetermined position relative to the outer legs prior to movement of the inner jaw assembly by the moving means.

* * * * *